(12) United States Patent
Benavides

(10) Patent No.: US 6,786,761 B1
(45) Date of Patent: Sep. 7, 2004

(54) METHOD AND SYSTEM FOR SENSING THE STATUS OF A ZIF SOCKET LEVER

(75) Inventor: John A. Benavides, Garland, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1 day.

(21) Appl. No.: 10/425,290

(22) Filed: Apr. 28, 2003

(51) Int. Cl.⁷ .............................................. H01R 3/00
(52) U.S. Cl. .................... 439/490; 439/489; 439/342
(58) Field of Search ............................ 439/490, 489, 439/342

(56) References Cited

U.S. PATENT DOCUMENTS

| | | | | |
|---|---|---|---|---|
| 4,377,315 A | * | 3/1983 | Grau | 439/59 |
| 6,338,646 B1 | * | 1/2002 | Hara et al. | 439/488 |
| 6,431,893 B1 | * | 8/2002 | Chang et al. | 439/188 |
| 6,488,528 B2 | * | 12/2002 | Nishioka | 439/489 |
| 6,692,276 B1 | * | 2/2004 | Abe et al. | 439/188 |
| 6,719,577 B2 | * | 4/2004 | Nogami | 439/188 |

* cited by examiner

*Primary Examiner*—Gary Paumen
(74) *Attorney, Agent, or Firm*—John Pessetto

(57) ABSTRACT

An embodiment of this invention provides a system and method for sensing the status of a ZIF socket lever. An LED is physically mounted to a socket. One lead of the LED is electrically connected to a positive voltage through a electrical contact on the socket. When the ZIF socket lever is closed, the other lead of the LED is connected to a ground. As a result, the LED is activated indicating the ZIF socket lever is closed.

16 Claims, 4 Drawing Sheets

US 6,786,761 B1

METHOD AND SYSTEM FOR SENSING THE STATUS OF A ZIF SOCKET LEVER

FIELD OF THE INVENTION

This invention relates generally to packaged integrated electronic circuits. More particularly, this invention relates to sensing the status of a ZIF socket lever.

BACKGROUND OF THE INVENTION

Very Large Scale Integrated (VLSI) chips may contain millions of transistors and electrical connections. Because VLSI chips may be so complex, a great deal of testing may be required to verify that a particular chip is fully functional. The time required to test an integrated circuit (IC) may increase the cost of an IC. As a result, it is desirable to reduce the time required to test an IC.

ICs are typically manufactured on a silicon wafer. Each silicon wafer may contain dozens of individual ICs. These ICs may be microprocessors, DRAMs (Dynamic Random Access Memory), SRAMs (Static Random Access Memory), or other types of ICs. The individual ICs on a silicon wafer are usually tested before the wafer is cut into separate, individual ICs. After all the ICs on the wafer are tested, the wafer is cut into separate, individual ICs and the ICs that passed the tests during wafer test are packaged.

Next, packaged ICs are tested. Packaged ICs are usually placed in a socket that is connected to external test equipment. The external test equipment applies power and signals to operate and test packaged ICs. The tests applied by test equipment can be very complex and as a result may require a relatively great deal of time to complete testing. Before applying the complete suite of tests found on external test equipment, it would be helpful to know if the ZIF (Zero Insertion Force) socket lever is closed.

Traditional ZIF sockets usually contain a mechanical indicator that communicates the status of the ZIF socket lever (open or closed). These indicators usually require a line of sight to verify that the ZIF socket lever is closed. In addition, traditional indicators may also require proper illumination from an external source to be viewed. In tightly packed systems, line of sight may be difficult to obtain. Also, neighboring parts may obscure illumination of the mechanical indicator.

There is a need in the art to solve the line of sight problem and the poor illumination problem associated with ZIF sockets. One embodiment of this invention communicates the status of the ZIF socket lever by activating an LED mounted to the ZIF socket when the ZIF socket lever is closed. A detailed description of this embodiment of this invention is described later.

Another embodiment of this invention communicates the status of the ZIF socket lever by activating a sound-generating device mounted to the ZIF socket when the ZIF socket lever is closed. Another embodiment of this invention communicates the status of the ZIF socket lever by generating an electrical signal when the ZIF socket lever is closed.

SUMMARY OF THE INVENTION

An embodiment of this invention provides a system and method for sensing the status of a ZIF socket lever. An LED is physically mounted to a ZIF socket. One lead of the LED is electrically connected to a positive voltage. When the ZIF socket lever is closed, the other lead of the LED is connected to a ground. As a result, the LED is activated indicating the ZIF socket lever is closed.

Other aspects and advantages of the present invention will become apparent from the following detailed description, taken in conjunction with the accompanying drawing, illustrating by way of example the principles of the invention.

DETAILED DESCRIPTION OF THE PREFERRED EMBODIMENT

Figure 1:
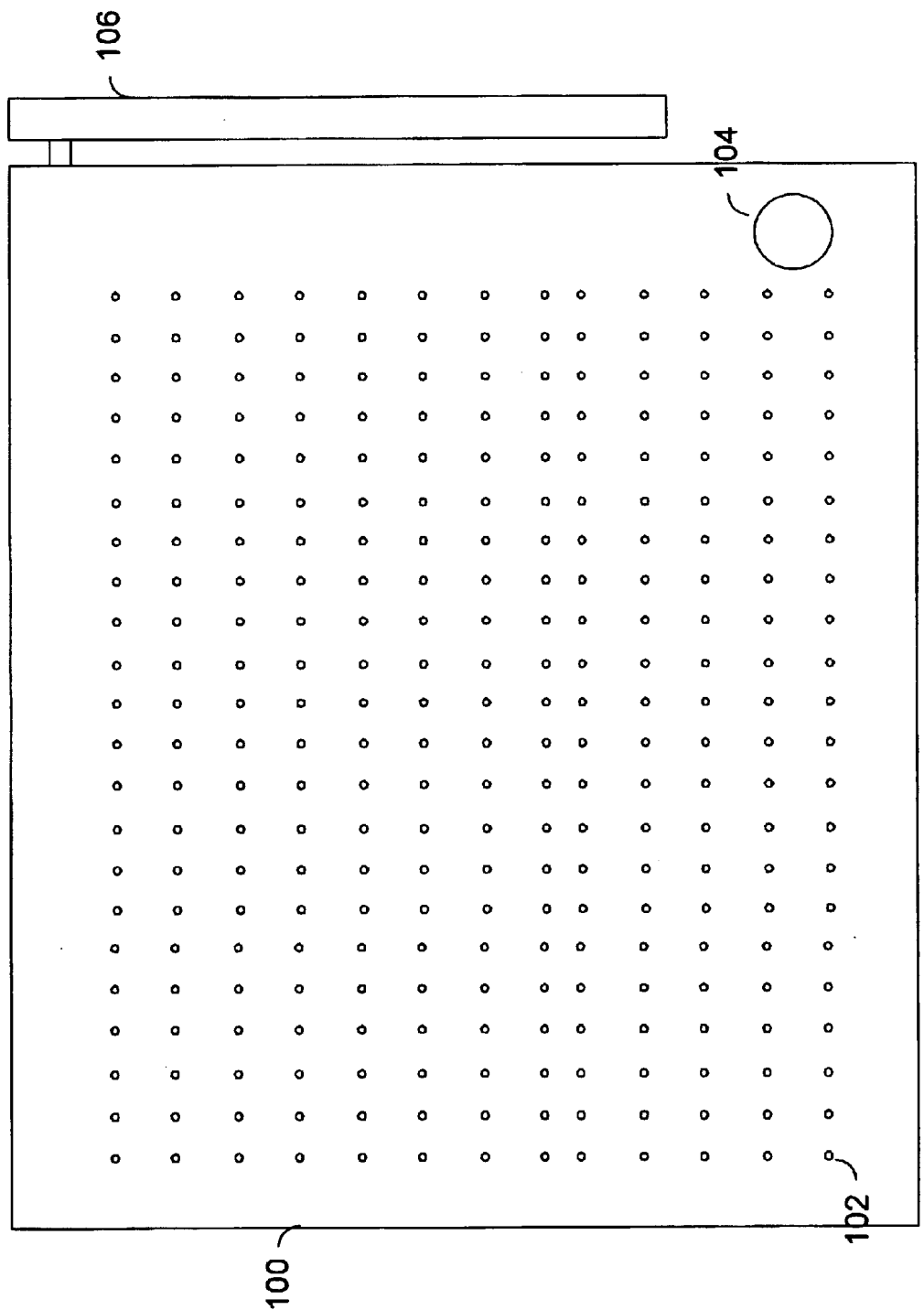
FIG. 1 is a mechanical drawing of a ZIF socket, a ZIF socket lever, and light source viewed from the top.

FIG. 1 is a mechanical drawing of a ZIF socket, 100, a ZIF socket lever, 106 and light source, 104, viewed from the top. Small circles represent socket holes 102. The ZIF socket lever 106, in this embodiment, is attached to the ZIF socket, 100 on the right. In this embodiment, the light source, 104 is physically mounted to the top of the ZIF socket, 100. One lead of the light source, 104, is electrically connected to a positive voltage. The other lead of the light source, 104, is connected to an electrical connection that connects to a ground path when the ZIF socket lever, 106, is closed. An activated light source, in this embodiment, indicates the ZIF socket lever, 106, is closed.

Closing the ZIF socket lever, 106, after inserting a packaged IC into the ZIF socket, 100, usually causes each pin inserted in the ZIF socket to be tightened. As a result of this tightening, most pins have an excellent physical and electrical connection to socket holes, 102, in the ZIF socket, 100. In some implementations of ZIF sockets, the external portion of the lever, 106, may be replaced with a screw, alien, or torx interface.

Figure 2:
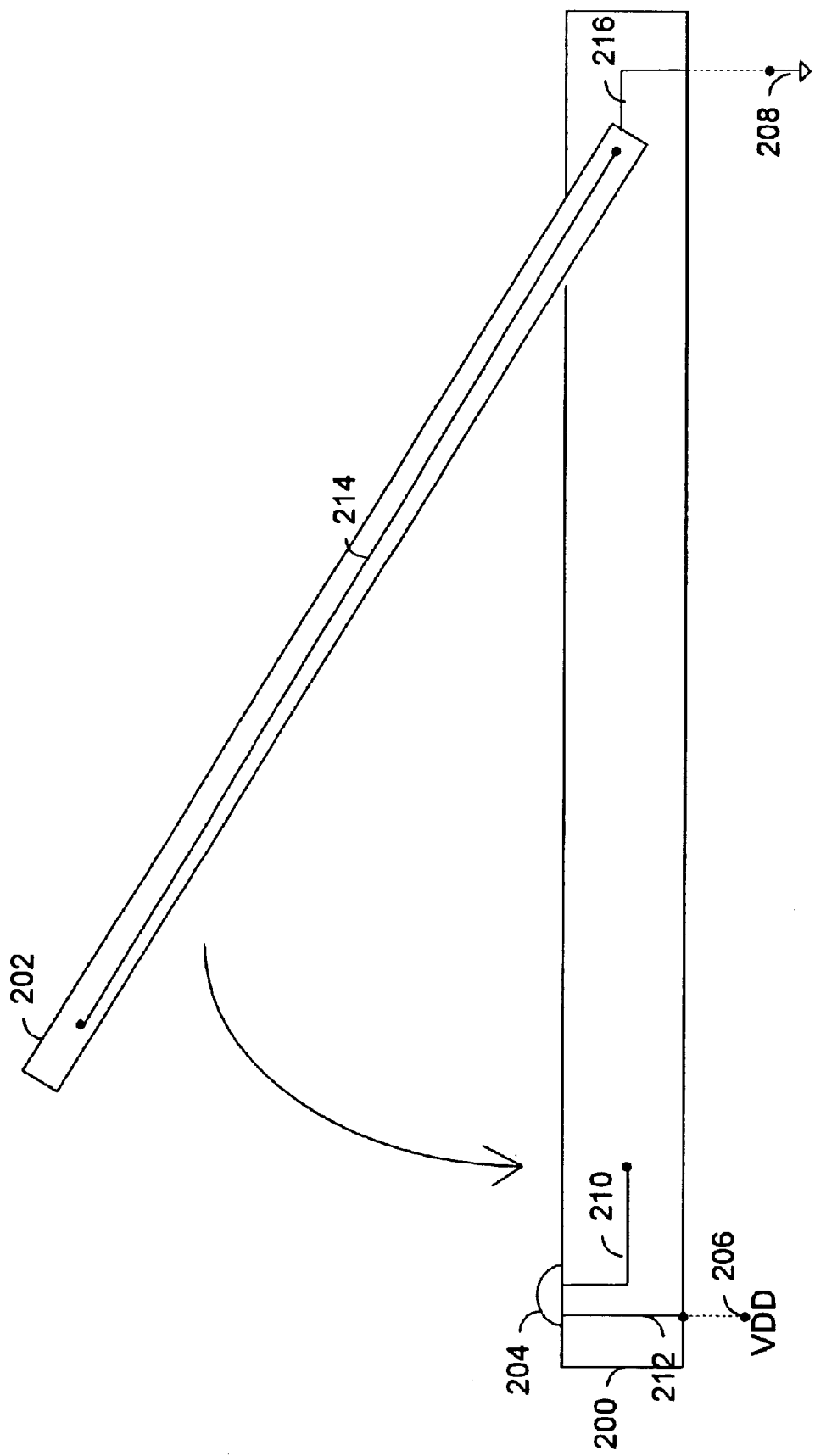
FIG. 2 is a mechanical drawing of a ZIF socket, a ZIF socket lever and a light source viewed from the side.

FIG. 2 is a mechanical drawing of a ZIF socket, 200, a ZIF socket lever, 202, and a light source, 204, viewed from the side. In this embodiment, the light source, 204, is physically mounted to the top of the ZIF socket, 200. One lead of the light source, 204, is electrically connected to an electrical contact, 212, on the ZIF socket, 200. A positive voltage, 206, may be connected to electrical contact 212. The other lead of the light source, 204, is connected to electrical contact 210.

In this example, when ZIF socket lever, 202, is closed, an electrical connection, from electrical contact, 210, through ground path, 214, to electrical contact 216 is made. When the ZIF socket lever 202 is closed and a ground, 208, is connected to electrical contact 216, and a positive voltage, 206, is connected to node 212, current is conducted through the light source 204. In this example, conducting current through light source 204 activates the light source, 204, indicating the ZIF socket lever, 202, is closed.

Figure 3:
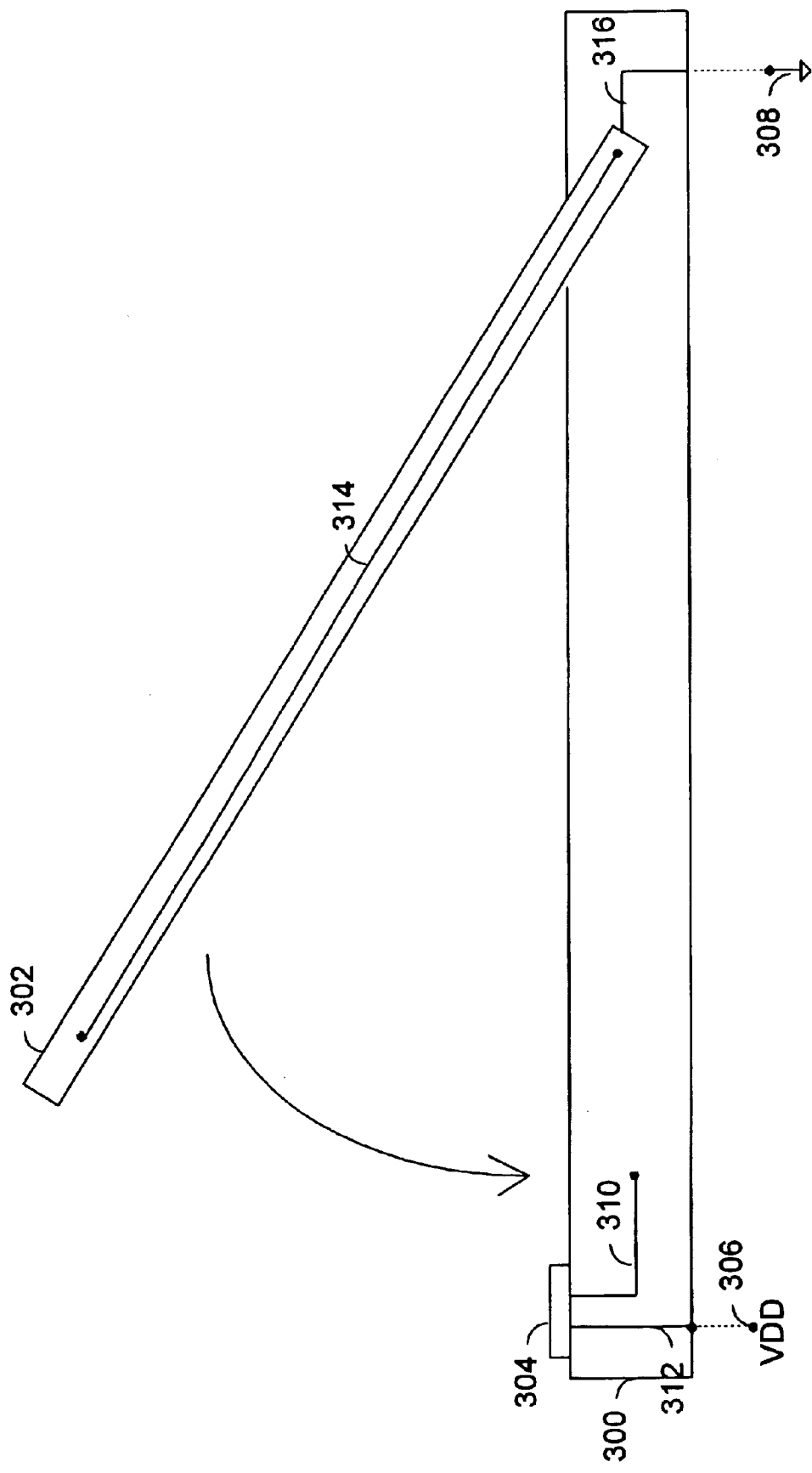
FIG. 3 is a mechanical drawing of a ZIF socket, a ZIF socket lever and an audio source viewed from the side.

FIG. 3 is a mechanical drawing of a ZIF socket, 300, a ZIF socket lever, 302, and an audio source, 304, viewed from the side. In this embodiment, the audio source, 304, is physically mounted to the top of the socket, 300. One lead of the audio source, 304, is electrically connected to an electrical contact, 312, on the ZIF socket, 300. A positive voltage, 306, may be connected to electrical contact 312. The other lead of the audio source, 304, is connected to electrical contact 310.

In this example, when ZIF socket lever, 302, is closed, an electrical connection, from electrical contact, 310, through ground path, 314, to electrical contact 316 is made. When the ZIF Socket lever 302 is closed and a ground, 308, is connected to electrical contact 316, and a positive voltage, 306, is connected to electrical contact 312, current is conducted through the audio source 304. In this example, conducting current through audio source 304 activates the audio source, 304, indicating the ZIF socket lever, 302, is closed.

Figure 4:
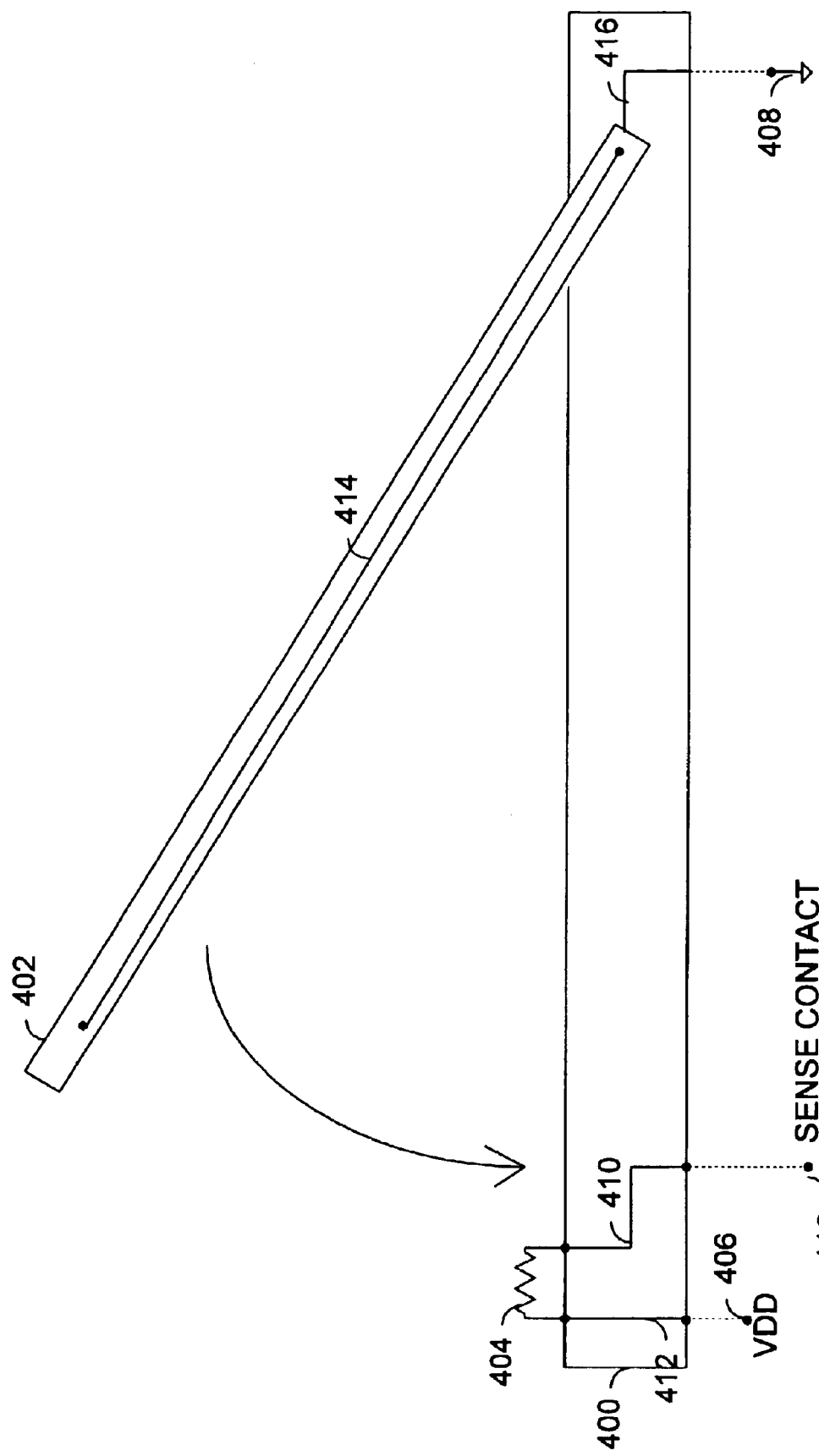
FIG. 4 is a mechanical drawing of a ZIF socket, a ZIF socket lever and a resistor viewed from the side.

FIG. 4 is a mechanical drawing of a ZIF socket, 400, a ZIF socket lever, 402, and a resistor, 404, viewed from the side. In this embodiment, the resistor, 404, is physically mounted to the top of the socket, 400. One lead of the resistor, 404, is electrically connected to an electrical contact, 412, on the ZIF socket, 400. A positive voltage, 406, may be connected to electrical contact 412. The other lead of the resistor, 404, is connected to electrical contact 410.

In this example, when ZIF socket lever, 402, is closed, an electrical connection, from electrical contact, 410, through ground path, 414, to electrical contact 416 is made. When the ZIF socket lever 402 is closed and a ground, 408, is connected to electrical contact 416, and a positive voltage, 406, is connected to electrical contact 412, current is conducted through resistor 404. In this example, conducting current through resistor 404 drops the voltage on electrical contact, 410 to near ground. The voltage on electrical contact 410 may be sensed by connecting sense contact 418 to electrical contact 410. The voltage on sense contact, 418, may be sent to external equipment. In this embodiment, a voltage near ground on the sense contact, 418, indicates the ZIF lever is closed.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system for sensing the status of a ZIF socket lever of an integrated circuit connector comprising:
   a) a ZIF socket;
   b) a light source, the light source physically and electrically connected to the ZIF socket;
   c) wherein the light source is activated when the ZIF socket lever is closed.

2. A system for sensing the status of a ZIF socket lever of an integrated circuit connector comprising:
   a) a ZIF socket;
   b) a light source, the light source physically mounted to the ZIF socket and electrically connected between a first electrical contact and a second electrical contact on the socket;
   c) wherein the light source is activated when the ZIF socket lever is closed.

3. A system for sensing the status of a ZIF socket lever of an integrated circuit connector comprising:
   a) a ZIF socket;
   b) a light source, the light source physically mounted to the ZIF socket and electrically connected between a first electrical contact and second electrical contact on the socket;
   c) wherein the first electrical contact is connected to a positive voltage;
   d) wherein the second electrical contact is connected to a ground when the ZIF socket lever is closed;
   e) wherein the light source is activated when the ZIF socket lever is closed.

4. The system in claim 3 wherein the light source is an LED.

5. A system for sensing the status of a ZIF socket lever of an integrated circuit connector comprising:
   a) a ZIF socket;
   b) an audio source, the audio source physically and electrically connected to the ZIF socket;
   c) wherein the audio source is activated when the ZIF socket lever is closed.

6. A system for sensing the status of a ZIF socket lever of an integrated circuit connector comprising:
   a) a ZIF socket;
   b) an audio source, the audio source physically mounted to the ZIF socket and electrically connected between a first electrical contact and a second electrical contact on the ZIF socket;
   c) wherein the audio source is activated when ZIF socket is closed.

7. A system for sensing the status of a ZIF socket lever of an integrated circuit connector comprising:
   a) a ZIF socket;
   b) an audio source, the audio source physically mounted to the ZIF socket and electrically connected between a first electrical contact and second electrical contact on the ZIF socket;
   c) wherein the first electrical contact is connected to a positive voltage;
   d) wherein the second electrical contact is connected to a ground when the ZIF socket lever is closed;
   e) wherein the audio source is activated when the ZIF socket lever is closed.

8. The system in claim 7 wherein the audio source is a piezo-electric buzzer.

9. A system for sensing the status of a ZIF socket lever of an integrated circuit connector comprising:
   a) a ZIF socket;
   b) a resistor, the resistor physically and electrically connected to the socket;
   c) wherein the resistor conducts current when the ZIF socket lever is closed.

10. A system for sensing the status of a ZIF socket lever of an integrated circuit connector comprising:
    a) a ZIF socket;
    b) a resistor, the resistor physically mounted to the socket and electrically connected between a first electrical contact and a second electrical contact on the socket;
    c) wherein the resistor conducts current when the ZIF socket lever is closed.

11. A system for sensing the status of a ZIF socket lever of an integrated circuit connector comprising:
    a) a ZIF socket;
    b) a resistor, the resistor physically mounted to the ZIF socket and electrically connected between a first electrical contact and second electrical contact on the ZIF socket;
    c) wherein the first electrical contact is connected to a positive voltage;

d) wherein the second electrical contact is connected to a ground when the ZIF socket lever is closed;

e) wherein the resistor conducts current when ZIF socket lever is closed.

12. A method for sensing the status of a ZIF socket lever of an integrated circuit connector comprising:

a) physically mounting a light source to a ZIF socket;

b) electrically connecting the light source between a first electrical contact and a second electrical contact on the ZIF socket;

c) closing the ZIF socket lever;

d) providing a positive voltage to the first electrical contact;

e) wherein the second electrical contact is connected to a ground when the ZIF socket lever is closed;

f) wherein the light source is activated when the ZIF socket lever is closed.

13. The method in claim 12 wherein the light source is an LED.

14. A method for sensing the status of a ZIF socket lever of an integrated circuit connector comprising:

a) physically mounting an audio source to a ZIF socket;

b) electrically connecting the audio source between a first electrical contact and a second electrical contact on the ZIF socket;

c) closing the ZIF socket lever;

d) providing a positive voltage to the first electrical contact;

e) wherein the second electrical contact is connected to a ground when the ZIF socket lever is closed;

f) wherein the audio source is activated when the ZIF socket lever is closed.

15. The method in claim 14 wherein the audio source is a piezo-electric buzzer.

16. A method for sensing the status of a ZIF socket lever of an integrated circuit connector comprising:

a) physically mounting a resistor to a ZIF socket;

b) electrically connecting the resistor between a first electrical contact and a second electrical contact on the ZIF socket;

c) closing the ZIF socket lever;

d) providing a positive voltage to the first electrical contact;

e) wherein the second electrical contact is connected to a ground when the ZIF socket lever is closed;

f) wherein the resistor conducts current when ZIF socket lever is closed.

* * * * *